US012654724B2

(12) United States Patent
Hao et al.

(10) Patent No.: US 12,654,724 B2
(45) Date of Patent: Jun. 16, 2026

(54) METHOD, SYSTEM, APPARATUS, AND MEDIUM FOR GENERATING CRITICAL SCENARIOS IN AUTONOMOUS DRIVING TESTS

(71) Applicant: Chang'an University, Xi'an (CN)

(72) Inventors: Ruru Hao, Xi'an (CN); Zhou Zhou, Xi'an (CN); Difei Zhang, Xi'an (CN); Licheng Zhang, Xi'an (CN); Rongtao Qiu, Xi'an (CN); Xin Cheng, Xi'an (CN); Yi Li, Xi'an (CN); Zhishun Wang, Xi'an (CN); Xuming Shang, Xi'an (CN); Jiahui Wang, Xi'an (CN)

(73) Assignee: CHANG'AN UNIVERSITY, Xi'an (CN)

( * ) Notice: Subject to any disclaimer, the term of this patent is extended or adjusted under 35 U.S.C. 154(b) by 0 days.

(21) Appl. No.: 19/300,635

(22) Filed: Aug. 14, 2025

(65) Prior Publication Data

US 2026/0048753 A1     Feb. 19, 2026

(30) Foreign Application Priority Data

Aug. 15, 2024    (CN) .......................... 202411122460.1

(51) Int. Cl.
  *B60W 50/04*        (2006.01)
  *B60W 30/12*        (2020.01)
        (Continued)

(52) U.S. Cl.
  CPC ...... *B60W 50/045* (2013.01); *B60W 50/0098* (2013.01); *B60W 60/001* (2020.02); *G06F 30/15* (2020.01); *B60W 30/12* (2013.01);

*B60W 30/18163* (2013.01); *B60W 2050/0031* (2013.01); *B60W 2552/10* (2020.02); *B60W 2554/4041* (2020.02);
        (Continued)

(58) Field of Classification Search
  None
  See application file for complete search history.

(56) References Cited

U.S. PATENT DOCUMENTS

| | | | |
|---|---|---|---|
| 2021/0009121 A1* | 1/2021 | Oboril | B60W 30/0953 |
| 2022/0194429 A1* | 6/2022 | Cho | B60W 60/0027 |
| 2025/0187598 A1* | 6/2025 | Clarke | B60W 30/162 |

* cited by examiner

*Primary Examiner* — James J Lee
*Assistant Examiner* — Jonathan E Reinert

(57)        ABSTRACT

A method, system, apparatus, and medium for generating critical scenarios in autonomous driving tests are provided. The method includes: generating an initial scenario based on a lane-coordinate system; constructing a one-way single-lane car-following scenario, specifically including: creating a road and vehicles based on the initial scenario, the vehicles including an autonomous vehicle controlled by an intelligent driving model (IDM) and an agent vehicle; constructing a one-way dual-lane cut-in scenario, specifically including: creating a dual-lane road and vehicles based on the initial scenario, the vehicles including an autonomous vehicle controlled by the IDM model and an intelligent-agent vehicle; and generating, based on the constructed one-way single-lane car-following scenario and the constructed one-way dual-lane cut-in scenario, critical scenarios for autonomous-vehicle testing. The method efficiently and accurately produces critical scenarios for autonomous-driving systems, thereby accelerating the testing and verification of their performance and safety in complex, high-risk environments.

8 Claims, 3 Drawing Sheets

(51) Int. Cl.
   *B60W 30/18*     (2012.01)
   *B60W 50/00*     (2006.01)
   *B60W 60/00*     (2020.01)
   *G06F 30/15*     (2020.01)
(52) U.S. Cl.
   CPC . *B60W 2554/802* (2020.02); *B60W 2554/804*
           (2020.02); *B60W 2720/106* (2013.01)

Initial status    Change lane    Change lane

Car-following scenario

Cut-in scenario

METHOD, SYSTEM, APPARATUS, AND MEDIUM FOR GENERATING CRITICAL SCENARIOS IN AUTONOMOUS DRIVING TESTS

CROSS-REFERENCE TO RELATED APPLICATION

This application claims the priority of Chinese Patent Application No. 202411122460.1, filed Aug. 15, 2024, which is herein incorporated by reference in its entirety.

TECHNICAL FIELD

The present disclosure relates to the field of critical-scenario generation technologies, and particularly to a method, system, apparatus, and medium for generating critical scenarios in autonomous driving tests.

BACKGROUND

Autonomous vehicles are widely regarded as a promising means of transportation for reducing traffic accidents, improving traffic efficiency, and lowering fuel consumption and pollutant emissions. Nevertheless, before widespread application, the autonomous vehicles still face numerous challenges, one of the most critical challenges is the testing and evaluation of autonomous driving systems. Scenario-based testing methods are considered promising approaches for the testing and evaluation of the autonomous driving systems.

The scenario-based testing methods validate whether the autonomous driving systems can safely perform expected functions in various traffic scenarios by defining different traffic participants (such as motor vehicles, pedestrians, and bicycles), motion trajectories of the different traffic participants, weather conditions, a road topology, and other factors within the driving environment. Current research on virtual simulation test scenario generation is primarily divided into two directions: one focuses on addressing scenario diversity, mainly employing data-driven or expert knowledge-based methods to construct scenario libraries with high coverage of real-world traffic scenarios; and the other focuses on critical scenario generation methods to accelerate testing. The data-driven methods for building scenario libraries first require collecting real-world driving data or traffic accident data, identifying scenarios from the real-world driving data or the traffic accident data, extracting implicit information related to the identified scenarios, parameterizing the scenario information, and modeling the scenarios. Finally, methods such as combinatorial generation or probability density sampling are used to generate new test scenario libraries to achieve extensive coverage of real-world traffic scenarios. Current research on critical scenario generation mainly concentrates on two aspects: critical scenario generation based on large deviation theory and optimization-based generation. Critical scenario generation methods based on large deviation theory typically employ importance sampling and cross-entropy techniques to sample critical scenarios from existing scenario libraries. These methods are mostly applied to simple scenarios having a limited number of vehicles and very short durations, and cannot be applied to complex scenarios having an interaction process between a vehicle-under-test and other dynamic traffic elements and a driving environment of spatiotemporal continuity. Optimization-based generation methods describe an interaction between traffic participants in a scenario as an optimization problem, continuously reducing a deviation between a collision risk during testing and an expected collision risk through iterative optimization, ultimately deriving critical scenarios that can test the extreme capabilities of the autonomous vehicles.

However, current test scenario generation methods do not account for the real-time interaction between the vehicle-under-test and its environment, as well as the spatiotemporal continuity of generated scenarios, consequently limiting accurate safety evaluation of autonomous vehicles in high-risk environments.

SUMMARY

In view of the shortcomings of the related art, which fail to consider the real-time interaction between the vehicle-under-test and its environment, as well as the spatiotemporal continuity of generated scenarios, the present disclosure proposes a method, system, apparatus, and medium for generating critical scenarios in autonomous driving tests. By constructing a one-way single-lane car-following scenario and a one-way dual-lane cut-in scenario, the present disclosure addresses the issues present in the related art.

In an embodiment, a method for generating critical scenarios in autonomous driving tests is provided, which includes the following steps:

constructing an initial vehicle driving test scenario based on a lane coordinate system;

constructing a one-way single-lane following scenario, including:

creating a road and vehicles based on the initial vehicle driving test scenario, the vehicles including an autonomous vehicle $V_{11}$ controlled by an intelligent driving model (IDM) and an agent vehicle $V_{12}$, where the autonomous vehicle $V_{11}$ follows the agent vehicle $V_{12}$; and using an influence of an acceleration change rate Jerk of the autonomous vehicle $V_{11}$ and a time-to-collision TTC of the autonomous vehicle $V_{11}$ on the one-way single-lane following scenario as a reward function of the one-way single-lane following scenario, where the higher the Jerk or the smaller the TTC, the higher a critical coefficient of the one-way single-lane following scenario;

constructing a one-way dual-lane cut-in scenario, including:

creating a dual-lane road and vehicles based on the initial vehicle driving test scenario, the vehicles including an autonomous vehicle $V_{21}$ controlled by the IDM and an agent vehicle $V_{22}$, where the agent vehicle $V_{22}$ is behind the autonomous vehicle $V_{21}$;

in response to the autonomous vehicle $V_{21}$ detecting that the agent vehicle $V_{22}$ in a current lane is approaching, choosing, by the autonomous vehicle $V_{21}$, to switch from the current lane to another lane;

in response to the autonomous vehicle $V_{21}$ moving away from the agent vehicle $V_{22}$, choosing, by the autonomous vehicle $V_{21}$, to keep driving on the current lane and decelerate;

introducing a responsibility-sensitive safety (RSS) model, and using a difference between a minimum longitudinal safe distance of the RSS model and an actual longitudinal distance between the autonomous vehicle $V_{21}$ and the agent vehicle $V_{22}$ as a reward function of the one-way dual-lane cut-in scenario;

for a target moment, when the actual longitudinal distance $d_{min}$ between the autonomous vehicle $V_{21}$ and the agent vehicle $V_{22}$ is less than the minimum longitudinal safe distance $d_{min\_RSS}$ of the RSS model, determining a scenario at the target moment as a critical scenario; and generating the critical scenarios in autonomous driving tests based on the constructed one-way single-lane following scenario and the constructed one-way dual-lane cut-in scenario.

In an embodiment, the constructing an initial vehicle driving test scenario based on a lane coordinate system includes:

generating, according to rationality rule, initial positions of all objects by using spatial logic and based on the lane coordinate system;

assuming that there are N elements in the initial vehicle driving test scenario, where $N \in \mathbb{N}_+$; a position of any one of the N elements is denoted by p, and $p=(p_x, p_y)^T \in \mathbb{R}^2$, where $p_x$ presents a projection position of the element on an x-axis in the lane coordinate system, and $p_y$ represents a projection position of the element on a y-axis in the lane coordinate system, expressing a distance between two elements, which are $item_i$ and $item_j$, as $dist(item_i, item_j)=|item_i \cdot p - item_j \cdot p|_2$, i, $j \in \{1,2, \ldots, N\}$, a set of all elements in the initial vehicle driving test scenario is denoted as $x=(item_1, item_2, \ldots, item_N)^T$, T represents matrix transposition, $item_i \cdot p$ represents a projection position of the element $item_i$ on the lane coordinate system, and $item_j \cdot p$ represents a projection position of the element $item_j$ on the lane coordinate system;

expressing positional relationships of the N elements on a two-dimensional plane based on projection as front, back, left, and right, represented by FrontOf, BackOf, LeftOf, and RightOf, respectively, where positional relationships of the elements $item_i$ and $item_j$ are defined as follows:

$$FrontOf(item_i, item_j) := proj_y(item_i \cdot p) > proj_y(item_j \cdot p)$$

$$BackOf(item_i, item_j) := \neg\, Front(item_i, item_j)$$

$$LeftOf(item_i, item_j) := proj_x(item_i \cdot p) < proj_x(item_j \cdot p)$$

$$RightOf(item_i, item_j) := \neg\, LeftOf(item_i, item_j)$$

where $proj_x$ presents a projection onto the x-axis, $proj_y$ presents a projection onto the y-axis, and $\neg$ represents negation; and expressing quantitatively a spatial relationship of the set of all elements x in the initial vehicle driving test scenario as follows: $\emptyset(x, \mathcal{R}) \in \mathbb{R}$, and expressing quantitatively a spatial relationship of the elements as follows:

$$\emptyset(x, LeftOf(item_i, item_j)) = proj(item_i \cdot p) - proj_x(item \cdot p)$$

$$\emptyset(x, RightOf(item_i, item_j)) = -\emptyset(x, LeftOf(item_i, item_j))$$

$$\emptyset(x, FrontOf(item_i, item_j)) = proj_y(item_i \cdot p) - proj_x(item \cdot p)$$

$$\emptyset(x, BackOf(item_i, item_j)) = -\emptyset(x, FrontOf(item_i, item_j))$$

-continued $$\emptyset(x, CloseTo(item_i, item_j)) = \varepsilon - dist(item_i, item_j)$$

$$\emptyset(x, FarFrom(item_i, item_j)) = dist(item_i, item_j) - M$$

where M and $\varepsilon$ represent user-defined large and small numbers, respectively.

In an embodiment, the influence of the acceleration change rate Jerk of the autonomous vehicle $V_{11}$ and the time-to-collision TTC of the autonomous vehicle $V_{11}$ on the one-way single-lane following scenario is used as the reward function of the one-way single-lane following scenario, and the reward function for the one-way single-lane following scenario is expressed as follows:

$$f(v_{follow}) =$$

$$\begin{cases} 0.1 * \text{Jerk} + 2/3 * (1/TTC - 1/2), & 4 \le \text{Jerk} \le 10,\ 0.5 \le TTC \le 2 \\ 0.1 * \text{Jerk}, & 4 \le \text{Jerk} \le 10,\ TTC = 0 \end{cases}$$

$$TTC = \frac{X_L(t) - X_F(t) - D_L}{V_F(t) - V_L(t)}, \ V_F(t) - V_L(t) > 0$$

$$\text{Jerk} = \frac{d(a)}{d(t)} = \frac{d^2(v)}{d(t)^2} = \frac{d^3(d)}{d(t)^3}$$

where $f(v_{follow})$ represents the reward function of the one-way single-lane following scenario, $X_{L(t)}$ represents a position of a leading vehicle (i.e., the agent vehicle $V_{12}$) at a time t, $X_{F(t)}$ represents a position of a following vehicle (i.e., the autonomous vehicle $V_{11}$) at the time t, $D_L$ represents a length of the leading vehicle, and $V_{F(t)} - V_{L(t)}$ represents a speed difference between the following vehicle and the leading vehicle at the time t; Jerk represents an acceleration change rate of the autonomous vehicle over time, the higher the Jerk, and the higher the critical coefficient of the one-way single-lane following scenario; TTC represents a time to collision, and the smaller the TTC, the higher a collision probability of the autonomous vehicle and the agent vehicle; and when the TTC is less than or equal to 2, the two vehicles are in a critical status where a collision is imminent.

In an embodiment, when an absolute value of the Jerk is greater than or equal to 4, the acceleration change rate of the autonomous vehicle $V_{11}$ with time reaches the critical status; when the TTC is less than or equal to 2, the two vehicles $V_{11}$ and $V_{12}$ are in the critical status where the collision is imminent.

In an embodiment, the difference between the minimum longitudinal safe distance of the RSS model and the actual longitudinal distance between the autonomous vehicle $V_{21}$ and the agent vehicle $V_{22}$ is used as the reward function of the one-way dual-lane cut-in scenario, and the reward function of the one-way dual-lane cut-in scenario is expressed as follows:

$$f(v_{cut\_in}) = d_{min\_RSS} - d_{min}$$

$$d_{min\_RSS} = \left[ v_r\rho + \frac{1}{2}a_{max,accel}\rho^2 + \frac{(v_r + \rho a_{max,accel})^2}{2a_{min,brake}} - \frac{v_f^2}{2a_{max,brake}} \right]$$

$$d_{min} = x_r - x_f$$

where $f(v_{cut\_in})$ represents the reward function of the cut-in scenario, $v_r$ and $v_f$ represent longitudinal speeds of a rear vehicle and a front vehicle, $\rho$ represents a response time, $\alpha_{max,accel}$ represents a maximum acceleration, $\alpha_{min,brake}$ represents a minimum deceleration, and $\alpha_{max,brake}$ represents a maximum deceleration; the RSS model is introduced, and thus for the target moment, when the actual longitudinal distance $d_{min}$ between the autonomous vehicle $V_{21}$ and the agent vehicle $V_{22}$ is less than the minimum longitudinal safe distance $d_{min\_RSS}$ of the RSS model, the scenario at the target moment is determined as the critical scenario.

In an embodiment, a system for generating critical scenarios in autonomous driving tests is provided, which includes:

an initial scenario generation module, configured for constructing an initial vehicle driving test scenario based on a lane coordinate system a car-following scenario construction module, configured for constructing a one-way single-lane following scenario, including:

creating a road and vehicles based on the initial vehicle driving test scenario, the vehicles including an autonomous vehicle $V_{11}$ controlled by an intelligent driving model IDM and an agent vehicle $V_{12}$, where the autonomous vehicle $V_{11}$ follows the agent vehicle $V_{12}$; and using an influence of an acceleration change rate Jerk of the autonomous vehicle $V_{11}$ and a time-to-collision TTC of the autonomous vehicle $V_{11}$ on the one-way single-lane following scenario as a reward function of the one-way single-lane following scenario, where the higher the Jerk or the smaller the TTC, the higher a critical coefficient of the one-way single-lane following scenario;

a cut-in scenario construction module, configured for constructing a one-way dual-lane cut-in scenario, including:

creating a dual-lane road and vehicles based on the initial vehicle driving test scenario, the vehicles including an autonomous vehicle $V_{21}$ controlled by the IDM and an agent vehicle $V_{22}$, where the agent vehicle $V_{22}$ is behind the autonomous vehicle $V_{21}$;

in response to the autonomous vehicle $V_{21}$ detecting that the agent vehicle $V_{22}$ in a current lane is approaching, choosing, by the autonomous vehicle $V_{21}$, to switch from the current lane to another lane;

in response to the autonomous vehicle $V_{21}$ moving away from the agent vehicle $V_{22}$, choosing, by the autonomous vehicle $V_{21}$, to keep driving on the current lane and decelerate;

introducing a responsibility-sensitive safety (RSS) model, and using a difference between a minimum longitudinal safe distance of the RSS model and an actual longitudinal distance between the autonomous vehicle $V_{21}$ and the agent vehicle $V_{22}$ as a reward function of the one-way dual-lane cut-in scenario;

for a target moment, when the actual longitudinal distance $d_{min}$ between the autonomous vehicle $V_{21}$ and the agent vehicle $V_{22}$ is less than the minimum longitudinal safe distance $d_{min\_RSS}$ of the RSS model, determining a scenario at the target moment as a critical scenario; and a critical scenario generation module, configured for generating the critical scenarios in autonomous driving tests based on the constructed one-way single-lane following scenario and the constructed one-way dual-lane cut-in scenario.

In an embodiment, a computer device for generating critical scenarios in autonomous driving tests is provided, which includes: a memory, a processor, and a computer program stored in the memory, where the processor is configured to, when executing the computer program, implement steps of the method for generating critical scenarios in autonomous driving tests described above.

In an embodiment, a non-transitory readable storage medium is provided, where a computer program including program instructions is stored in the readable storage medium, and the program instructions, when executed by a processor, are configured to perform steps of the method for generating critical scenarios in autonomous driving tests described above.

The method, system, apparatus, and medium for generating critical scenarios in autonomous driving tests at least have the following beneficial effects.

The present disclosure constructs a one-way single-lane car-following scenario by setting an autonomous vehicle and an agent vehicle, using the influence of the autonomous vehicle's acceleration change rate Jerk and TTC as its reward function. Simultaneously, the present disclosure constructs a one-way dual-lane cut-in scenario by positioning an autonomous vehicle behind an agent vehicle and defining a reward function based on the comparison between the actual distance and the minimum longitudinal safe distance of an RSS model. By addressing the real-time interaction between the test vehicle and the environment and the spatiotemporal continuity of generated scenarios, the disclosure efficiently and accurately generates high-risk scenarios for autonomous driving systems by constructing the one-way single-lane following scenario and the one-way dual-lane cut-in scenario. The present disclosure accelerates the testing and validation of autonomous vehicle performance and safety in complex and high-risk environments. The method significantly enhances the reliability and safety of autonomous vehicles under complex and critical conditions.

DETAILED DESCRIPTION OF EMBODIMENTS

The following will describe technical solutions in embodiments of the present disclosure clearly and completely in conjunction with accompanying drawings. Apparently, the described embodiments are only a part of embodiments of the present disclosure, rather than all of them.

The present disclosure proposes a reinforcement learning-based method for generating critical scenarios in autonomous driving tests, which specifically includes the following steps S1 through S5.

In step S1, an in-depth analysis is performed on testing tasks and scenario elements of an autonomous driving system, and the scenario elements are divided into three types: road structures, dynamic elements, and weather elements.

Figure 1:
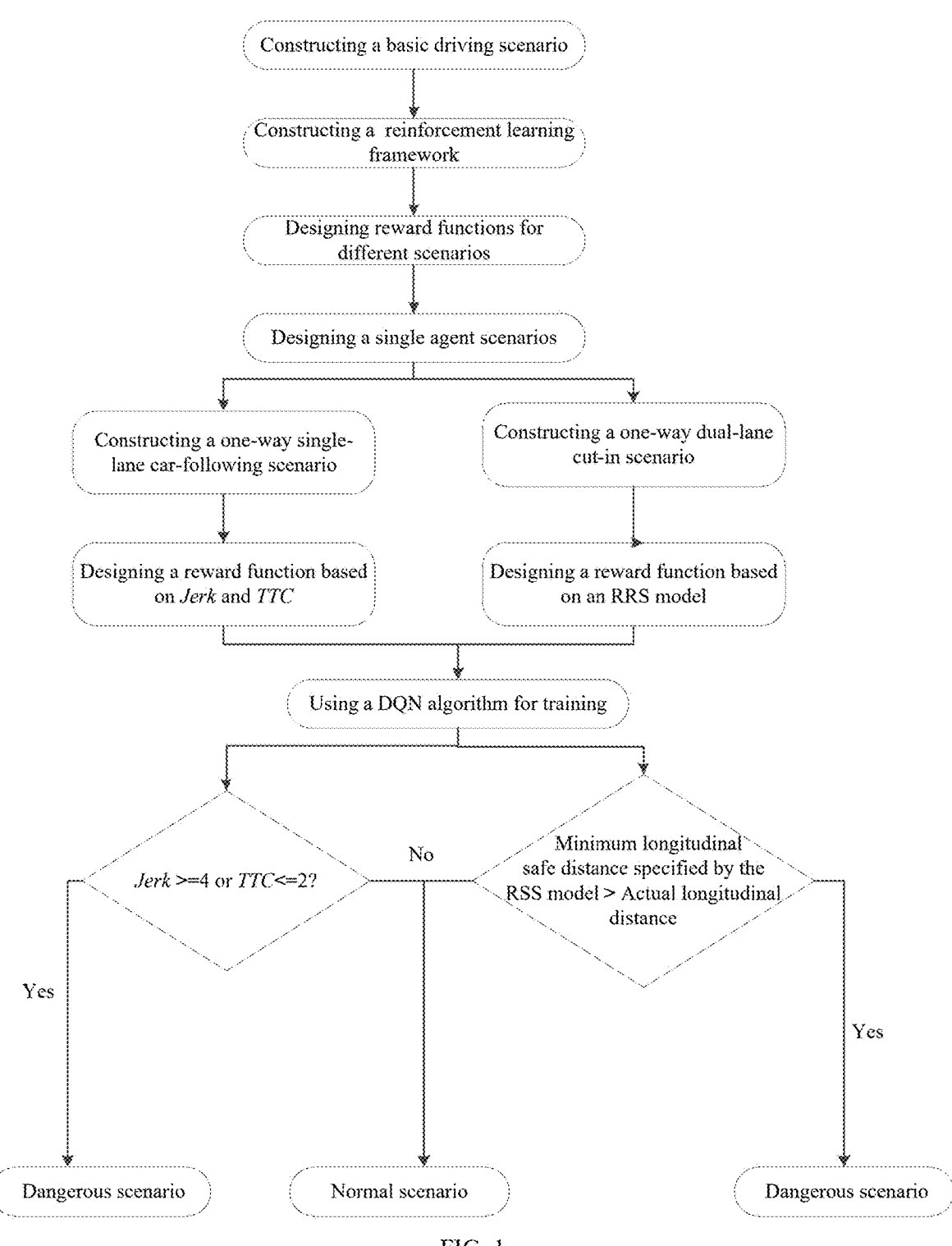
FIG. 1 illustrates a flowchart of a method for generating critical scenarios in autonomous driving tests according to an embodiment of the present disclosure.

Starting from the testing tasks, the test scenario is defined at three different levels of abstraction—a functional scenario, a logical scenario, and a concrete scenario. The functional scenario is the most abstract level of scenario description, which uses a natural language to abstractly describe entities involved in the testing task, behaviors of the entities, and relationships of the entities, and helps to establish a consistent understanding of the meaning of the test scenario. The logical scenario imposes constraints on boundaries of scenario parameters based on the functional scenario, and specifies ranges of the scenario parameters using probability distributions (e.g., Gaussian distribution, uniform distribution), correlation functions, or specifies ranges of the scenario parameters using numerical values or numerical conditions (e.g., a speed of an overtaking vehicle must be greater than that of an overtaken vehicle). The concrete scenario instantiates the logical scenario by assigning specific values to scenario parameters within the ranges of the scenario parameters specified by logical scenario. For the logical scenario with a continuous value range, any number of concrete scenarios can be derived. The specific embodiment is illustrated in FIG. 1.

In step S2, positional relationships of the scenario elements are described using spatial logic; and a lane coordinate system is used to generate initial positions of all objects according to rationality rule, thereby ensuring reasonableness of the initial positions.

It is assumed that there are N elements in the test scenario, where $N \in \mathbb{N}_+$; a position of any one of the N elements is denoted by p, and $p-(p_x, p_y)^T \in \mathbb{R}^2$ where $p_x$ presents a projection position of the element on an x-axis in the lane coordinate system, and $p_y$ represents a projection position of the element on a y-axis in the lane coordinate system, then a distance between two elements, i.e., $item_i$ and $item_j$, may be expressed as $dist(item_i, item_j) = |item_i \cdot p - item_j \cdot p|_2$, $i, j \in \{1, 2, \ldots, N\}$. A set of all elements in the test scenario is denoted as $x = (item_1, item_2, \ldots, item_N)^T$. Thus, based on the given coordinate system, this present disclosure can define spatial relationships among the all elements in the test scenario according to spatial logic.

Positional relationships of elements on a two-dimensional plane based on projection are front, back, left, and right, represented by FrontOf, BackOf, LeftOf, and RightOf, respectively. Positional relationships of $item_i$ and $item_j$ are defined as follows:

$$FrontOf(item_i, item_j) := proj_y(item_i \cdot p) > proj_y(item_j \cdot p)$$

$$BackOf(item_i, item_j) := \neg \, Front(item_i, item_j)$$

$$LeftOf(item_i, item_j) := proj_x(item_i \cdot p) < proj_x(item_j \cdot p)$$

$$RightOf(item_i, item_j) := \neg \, LeftOf(item_i, item_j)$$

where $proj_x$ presents a projection onto the x-axis, $proj_y$ presents a projection onto the y-axis, and $\neg$ represents negation.

Figure 2:
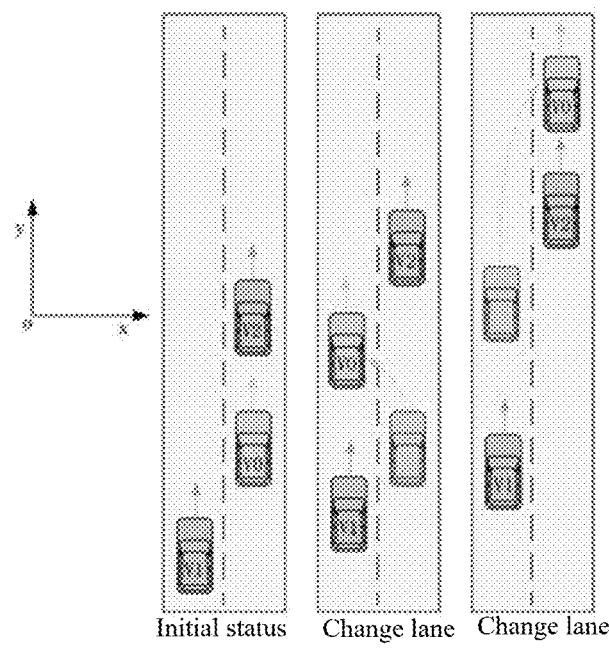
FIG. 2 illustrates a schematic view of overtaking according to an embodiment of the present disclosure.

An initial status in FIG. 2 is taken as an example, in this scenario, if a test vehicle $V_0$ is on a right side of a surrounding vehicle $V_1$, a positional relationship thereof is expressed as $RightOf(V_0, V_1)$. If the test vehicle $V_0$ is in front of the surrounding vehicle $V_1$, the positional relationship thereof is expressed as $FrontO(V_0, V_1)$. If the test vehicle $V_0$ is behind the surrounding vehicle $V_2$, the positional relationship thereof is expressed as $BackOf(V_0, V_2)$. Additionally, spatial relationships based on distance can be used to define far and near between two elements, represented by FarFrom and CloseTo, respectively, which are defined as follows:

$$FarFrom(item_i, item_j) := dist(item_i, item_j) \geq M$$

$$CloseTo(item_i, item_j) := dis(item_i, item_j) \leq \varepsilon$$

A completion status of a testing task and a risk assessment of the test scenario also require quantitative representation of positional relationships. In the present disclosure, positional relationships of the scenario elements are described using spatial logic; and a lane coordinate system is used to generate initial positions of all objects according to rationality rule, thereby ensuring reasonableness of the initial positions. During scenario evolution, spatial logic is then used to constrain a scenario search space, thereby to generate a structured and effective scenario.

In the above formulas, M and & are user-defined large and small numbers, respectively.

Combining of spatial relationships with Boolean operators can form a more complex description of positional relationships. For example, a complex positional relationship is expressed as follows: $\mathcal{R} := T|rel_1(item_i)|rel_2(item_i, item_j)|\neg \mathcal{R} \, | \mathcal{R}_i \wedge \mathcal{R}_j | \mathcal{R}_i \vee \mathcal{R}_j$, where T represents Boolean true, and $rel_1$ and $rel_2$ represent unary and binary spatial relationships, respectively. In the present disclosure, a spatial relationship on the set of all elements x in the test scenario is expressed quantitatively as follows: $\emptyset(x, \mathcal{R}) \in \mathbb{R}$, and a spatial relationship of elements are quantitatively expressed as:

$$\emptyset(x, LeftOf(item_i, item_j)) = proj(item_i \cdot p) - proj_x(item \cdot p)$$

$$\emptyset(x, RightOf(item_i, item_j)) = -\emptyset(x, LeftOf(item_i, item_j))$$

$$\emptyset(x, FrontOf(item_i, item_j)) = proj_y(item_i \cdot p) - proj_x(item \cdot p)$$

$$\emptyset(x, BackOf(item_i, item_j)) = -\emptyset(x, FrontOf(item_i, item_j))$$

$$\emptyset(x, CloseTo(item_i, item_j)) = \varepsilon - dist(item_i, item_j)$$

$$\emptyset(x, FarFrom(item_i, item_j)) = dist(item_i, item_j) - M$$

In step S3, in a virtual highway environment, a car-following scenario, a cut-in scenario, a reward function of the car-following scenario, and a reward function of the cut-in scenario are designed.

Based on an open-source environment highway-env, a one-way single-lane car-following scenario is designed. Specifically, functions including create_road and create_vehicles are used to create a road and vehicles. The vehicles include an autonomous vehicle $V_{11}$ controlled by an intelligent driving model (IDM) and an agent vehicle $V_{12}$, where $V_{11}$ follows $V_{12}$. Based on the open-source environment highway-env, a one-way dual-lane car-following scenario is designed. Specifically, the functions including create_road and create_vehicles are used to create a road and vehicles. The vehicles include an autonomous vehicle $V_{21}$ controlled by the IDM and an agent vehicle $V_{22}$. In an embodiment, step S3 includes steps S3.1 and S3.2.

In step S3.1, the reward function of the car-following scenario is defined as follows:

$$f(v_{follow}) =$$

$$\begin{cases} 0.1 * \text{Jerk} + 2/3 * (1/TTC - 1/2), 4 \le \text{Jerk} \le 10, 0.5 \le TTC \le 2 \\ 0.1 * \text{Jerk}, 4 \le \text{Jerk} \le 10, TTC = 0 \end{cases}$$

$$TTC = \frac{X_L(t) - X_F(t) - D_L}{V_F(t) - V_L(t)}, V_F(t) - V_L(t) > 0$$

$$\text{Jerk} = \frac{d(a)}{d(t)} = \frac{d^2(v)}{d(t)^2} = \frac{d^3(d)}{d(t)^3}$$

where $f(v_{follow})$ represents the reward function of the car-following scenario, $X_{L(t)}$ represents a position of a leading vehicle at a time t, $X_{F(t)}$ represents a position of a following vehicle at the time t, $D_L$ represents a length of the leading vehicle, and $V_{F(t)} - V_{L(t)}$ represents a speed difference between the following vehicle and the leading vehicle at the time t. In the car-following scenario, the following vehicle passively adjusts its status based on a status of the leading vehicle. Acceleration and braking of the leading vehicle will both affect the following vehicle. Jerk represents an acceleration change rate of a vehicle over time, and is used to describe smoothness and comfort of motion. The higher the Jerk, the more abrupt the motion, and the higher the risk of the test scenario. When an absolute value of Jerk is greater than or equal to 4, a driver and passengers will clearly feel jolts. TTC represents a time to collision, and is a metric that estimates how soon two moving objects might collide. The smaller the TTC, the higher the collision probability. When TTC is less than or equal to 2, the two objects are in a critical status where a collision is imminent. Therefore, controlling the Jerk and the TTC of $V_{11}$ to stay within these critical ranges is one of the key rewards in a reinforcement learning process.

In step 3.2, the reward function of the cut-in scenario is defined as follows:

$$f(v_{cut\_in}) = d_{min\_RSS} - d_{min}$$

$$d_{min\_RSS} = \left[ v_r \rho + \frac{1}{2} a_{max,accel} \rho^2 + \frac{(v_r + \rho a_{max,accel})^2}{2 a_{min,brake}} - \frac{v_f^2}{2 a_{max,brake}} \right]$$

$$d_{min} = x_r - x_f$$

where $f(v_{cut\_in})$ represents the reward function of the cut-in scenario, $v_r$ and $v_f$ represent longitudinal speeds of a rear vehicle and a front vehicle, $\rho$ represents a response time, $\alpha_{max,accel}$ represents a maximum acceleration, $\alpha_{max,accel}$ represents a minimum deceleration, and $\alpha_{max,brake}$ represents a maximum deceleration.

In the cut-in scenario, the biggest challenge is to ensure that $V_{22}$ can execute a reasonable lane change while simultaneously guaranteeing a risk level of the test scenario. To ensure the rationality of the lane change, the present disclosure applies a well-established mobile cut-in model to $V_{22}$.

To maintain the risk level of the test scenario, a responsibility-sensitive safety (RSS) model is introduced. At any given moment, if an actual distance $d_{min}$ between $V_{21}$ and $V_{22}$ is less than a minimum longitudinal safe distance $d_{min\_RSS}$ specified by the RSS model, a scenario at that moment is considered as a critical scenario. Therefore, in the cut-in scenario, ensuring that $d_{min} < d_{min\_RSS}$ is one of the key rewards during the reinforcement learning process.

In step S4, other elements of reinforcement learning are designed, which include a status space and an action space, and reinforcement learning based on a deep q-network (DQN) algorithm is trained. The agent vehicle will continuously escalate a risk level of the test scenario according to a designed objective.

Figure 3:
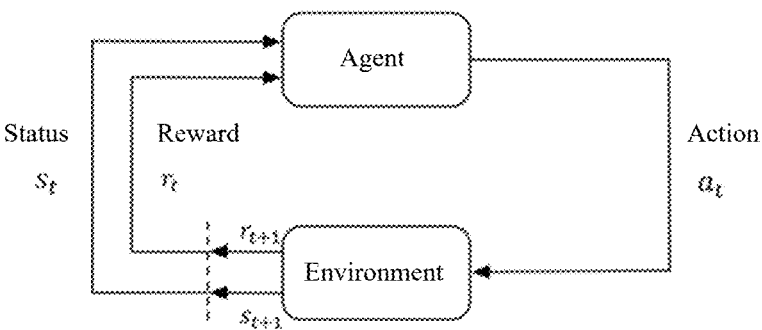
FIG. 3 illustrates a training view of reinforcement learning according to an embodiment of the present disclosure.

A reinforcement learning algorithm relies on direct interaction between the agent vehicle and an environment, and learns and optimizes strategies through trial and error, as illustrated in FIG. 3. Specifically, the agent vehicle obtains current status information s from the environment and generates a corresponding action based on a predefined policy. After executing the action, the environment provides feedback in the form of a next status $s_{t+1}$ and a reward obtained from the current action (i.e., the corresponding action).

The status space is defined as a vast status space S (i.e., a global status space) encompassing global information, which is jointly constructed within an intricate traffic network. With respect to the design of the state space, considering the complexity of vehicle interaction in the autonomous driving test environment, the decision-making of agent vehicles not only depends on their own state information, but also depends on the state information of adjacent vehicles. In the present disclosure, an observed state of the agent vehicle at each moment is constructed as a dimensional state vector, including the positions, the speeds, and the accelerations of the agent vehicle itself and adjacent vehicles.

The action space is defined as follows: taking the cut-in scenario as an example—for an agent vehicle employing a reinforcement learning algorithm, there are two possible actions to choose from at each decision step: "change lane" and "maintain current lane". When the agent vehicle detects an obstacle in its current lane or a vehicle in the adjacent lane approaching from behind, the agent vehicle should choose "change lane" to generate a higher-risk scenario. When the agent vehicle is far from the vehicle in the adjacent lane behind it, the agent vehicle should instead choose "maintain current lane" and decelerate to reduce a distance from the vehicle. Therefore, the action space of the agent vehicle is defined as the following two actions: "change lane" and "maintain current lane". Through the combination of these action choices, the agent vehicle can make decisions based on real-time traffic conditions to heighten the risk level of the test scenario.

In step S5, after training the car-following and cut-in scenarios in the virtual highway environment, the reinforcement learning model is saved for application in an autonomous driving testing step, where it will be used in conjunction with autonomous vehicles.

The present disclosure proposes an implementation as follows.

Figure 4A:
FIG. 4A illustrates a schematic view of a car-following scenario according to an embodiment of the present disclosure.
Figure 4B:
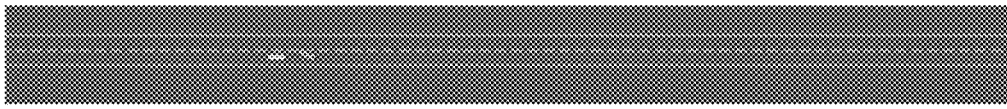
FIG. 4B illustrates a schematic view of a cut-in scenario according to an embodiment of the present disclosure.

(1) Environment setup: the environment used in the present disclosure is based on an open-source simulation environment highway-env. The car-following scenario is shown in FIG. 4A, where a corresponding lane is 1000 meters long and is a one-way single-lane, and vehicles travel from left to right in FIG. 4A. The cut-in scenario is shown in FIG. 4B, where a corresponding lane is 1000 meters long and is a one-way dual-lane, and vehicles travel from left to right in FIG. 4B.

(2) Evaluation metrics: algorithm evaluation metrics used in the present disclosure include: a. average speeds, which are average travel speeds of all vehicles on the lane; b. a collision count, which is a total number of collisions between $V_{11}$ and $V_{21}$ from the start to the end across 10 simulations; c. vehicle distances, which are longitudinal distances between $V_{11}$ and $V_{21}$, as well as between $V_{21}$ and $V_{22}$ across the 10 simulations; d. a scenario risk level, for the car-following scenario, a weighted sum of Jerk and 1/TTC across the 10 simulations reflects the risk level of the car-following scenario; for the cut-in scenario, a difference between a minimum longitudinal safe distance of the RSS model and an actual longitudinal distance $d_{lon}$ between $V_{21}$ and $V_{22}$ across 10 simulations to reflect the risk level of the run-in scenario.

(3) Experimental process: the present disclosure constructs a method for generating critical scenarios in autonomous driving tests for an autonomous vehicle, which can provide a critical test scenario for an autonomous vehicle. The method is implemented based on the open-source simulation environment highway-env, using Python to build car-following and cut-in scenarios and calling Pygame to simulate the scenarios. An IDM, a mobile model, and an RSS model are used to assess the feasibility and risk level of the scenarios. A reinforcement learning approach based on the DQN algorithm is employed for a simulation experiment. During the simulation experiment, the agent vehicles $V_{12}$ and $V_{22}$ respectively interact with the autonomous vehicles $V_{11}$ and $V_{21}$ to obtain real-time status data. Reinforcement learning model determines next status data based on a reward and current status data, ultimately completing the training of the reinforcement learning model. The trained reinforcement learning model is then imported into open-source simulation environment highway-env to conduct a simulation test.

By adopting a reinforcement learning-based method, the present disclosure considers rationality and risk levels of scenarios to generate critical scenarios that align with academic definitions. To some extent, the present disclosure addresses the limitations of existing testing methods, such as insufficient scenario diversity, long testing cycles, high costs, and inadequate coverage of extreme and rare critical scenarios.

Figure 5:
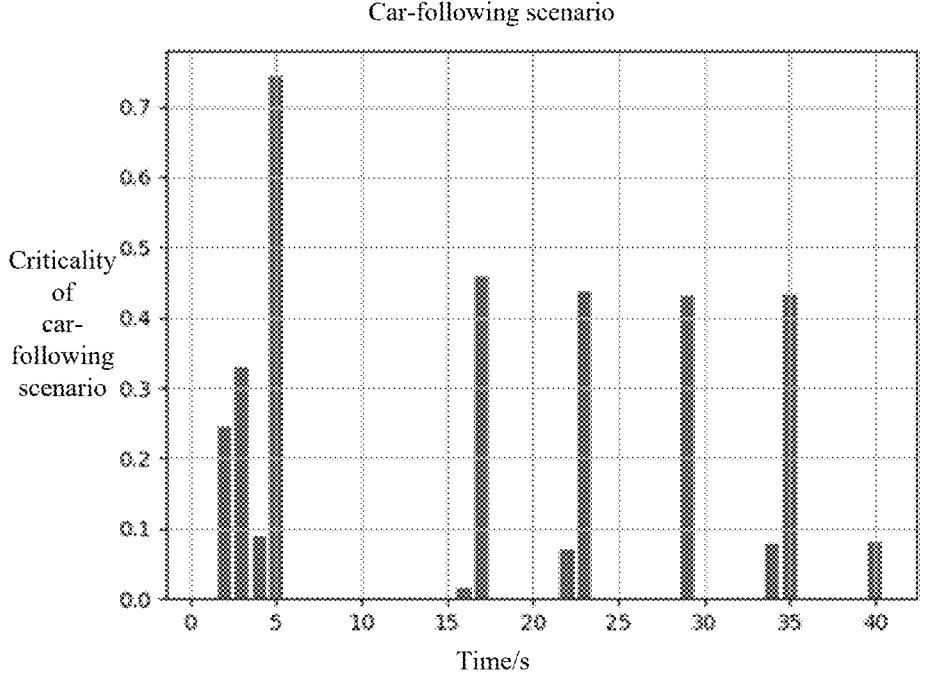
FIG. 5 illustrates a schematic view of criticality at each moment in the car-following scenario according to an embodiment of the present disclosure.
Figure 6:
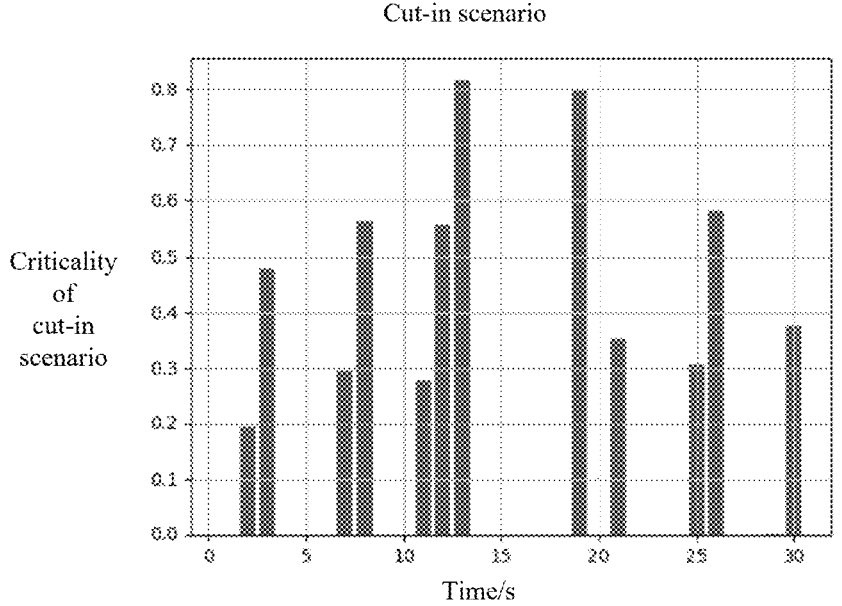
FIG. 6 illustrates a schematic view of criticality at each moment in the cut-in scenario according to an embodiment of the present disclosure.

The present disclosure constructs a method for generating critical scenarios in autonomous driving tests, providing critical test scenarios to shorten a testing cycle. First, a base scenario is constructed, and two typical test scenarios are designed: car-following and cut-in scenarios. The RSS model, the TTC, and the Jerk are used to constrain the rationality and risk level of the scenarios. In a 40-second simulation for a car-following scenario, critical scenarios accounted for approximately 36.3% of a total time, as shown in FIG. 5. In a 30-second simulation for a cut-in scenario, critical scenarios accounted for approximately 51.6% of the total time, as shown in FIG. 6.

Based on the same inventive concept, the present disclosure also proposes a system for generating critical scenarios in autonomous driving tests, including:

an initial scenario generation module, configured to generate an initial scenario based on a lane coordinate system;

a car-following scenario construction module, configured to construct a car-following scenario, including: creating a road and vehicles based on the initial scenario, the vehicles include an autonomous vehicle $V_{11}$ controlled by an IDM and an agent vehicle $V_{12}$, where $V_{11}$ follows $V_{12}$, an influence of Jerk and TTC of the autonomous vehicle $V_{11}$ on the car-following scenario is used as a reward function of the car-following scenario; and the higher the Jerk and the lower the TTC', the higher the risk level of the car-following scenario;

a cut-in scenario construction module, configured to construct a cut-in scenario, including: creating a dual-lane road and vehicles based on the initial scenario, the vehicles include an autonomous vehicle $V_{21}$ controlled by the IDM and an agent vehicle $V_{22}$, where the agent vehicle $V_{22}$ is behind the autonomous vehicle $V_{21}$; when the autonomous vehicle $V_{21}$ detects that the agent vehicle $V_{22}$ in a current lane is approaching, the autonomous vehicle $V_{21}$ chooses to switch from the current lane to another lane; when the autonomous vehicle $V_{21}$ moves away from the agent vehicle $V_{22}$, the autonomous vehicle $V_{21}$ maintains driving on the current lane and decelerates; an RSS model is introduced, and a difference between a minimum longitudinal safe distance of the RSS model and an actual longitudinal distance between the autonomous vehicle $V_{21}$ and the agent vehicle $V_{22}$ is used as a reward function of the cut-in scenario; and at any given moment, when the actual longitudinal distance $d_{min}$ between the autonomous vehicle $V_{21}$ and the agent vehicle $V_{22}$ is less than the minimum longitudinal safe distance $d_{min\_RSS}$ specified by the RSS model, a scenario at that moment is considered as a critical scenario; and a critical scenario generation module, configured to generate the critical scenarios in autonomous driving tests based on the car-following scenario and the cut-in scenario.

In an embodiment, each of the initial scenario generation module, the car-following scenario construction module, the cut-in scenario construction module, and the critical scenario generation module is embodied by at least one processor and at least one memory coupled to the at least one processor, and the at least one memory stores computer programs executable by the at least one processor.

Based on the same inventive concept, the present disclosure also proposes a computer device for generating critical scenarios in autonomous driving tests, which includes: a memory, a processor, and a computer program stored in the memory. When the processor is configured to execute the computer program, the processor implements steps of the method for generating critical scenarios in autonomous driving tests.

Based on the same inventive concept, the present disclosure also proposes a non-transitory readable storage medium storing a computer program. The computer program includes program instructions that, when executed by a processor, perform steps of the method for generating critical scenarios in autonomous driving tests.

The above descriptions are only preferred specific embodiments of the present disclosure. However, the scope of protection of the present disclosure is not limited to this. Any person skilled in the art of the present disclosure, within the technical scope disclosed by the present disclosure, may make equivalent replacements or modifications based on the technical solutions and inventive concepts of the present disclosure, and such changes shall fall within the protection scope of the present disclosure.

What is claimed is:

1. A method for generating critical scenarios in autonomous driving tests, comprising the following steps:

constructing an initial vehicle driving test scenario based on a lane coordinate system;

constructing a one-way single-lane following scenario, comprising:

creating a road and vehicles based on the initial vehicle driving test scenario, the vehicles comprising an autonomous vehicle $V_{11}$ controlled by an intelligent driving model (IDM) and an agent vehicle $V_{12}$, where the autonomous vehicle $V_{11}$ follows the agent vehicle $V_{12}$; and using an influence of an acceleration change rate Jerk of the autonomous vehicle $V_{11}$ and a time-to-collision TTC of the autonomous vehicle $V_{11}$ on the one-way single-lane following scenario as a reward function of the one-way single-lane following scenario, wherein the higher the Jerk and the smaller the TTC, the higher a critical coefficient of the one-way single-lane following scenario;

constructing a one-way dual-lane cut-in scenario, comprising:

creating a dual-lane road and vehicles based on the initial vehicle driving test scenario, the vehicles comprising an autonomous vehicle $V_{21}$ based on the controlled by and an agent vehicle $V_{22}$, wherein the agent vehicle $V_{22}$ is behind the autonomous vehicle $V_{21}$;

in response to the autonomous vehicle $V_{21}$ detecting that the agent vehicle $V_{22}$ in a current lane is approaching, choosing, by the autonomous vehicle $V_{21}$, to switch from the current lane to another lane;

in response to the autonomous vehicle $V_{21}$ moving away from the agent vehicle $V_{22}$,choosing, by the autonomous vehicle $V_{21}$, to keep driving on the current lane and decelerate;

introducing a responsibility-sensitive safety (RSS) model, and using a difference between a minimum longitudinal safe distance of the RSS model and an actual longitudinal distance between the autonomous vehicle $V_{21}$ and the agent vehicle $V_{22}$ as a reward function of the one-way dual-lane cut-in scenario; and for a target moment, when the actual longitudinal distance $d_{min}$ between the autonomous vehicle $V_{21}$ and the agent vehicle $V_{22}$ is less than the minimum longitudinal safe distance $d_{min\_RSS}$ of the RSS model, determining a scenario at the target moment as a critical scenario; and generating the critical scenarios in autonomous driving tests based on the constructed one-way single-lane following scenario and the constructed one-way dual-lane cut-in scenario.

2. The method for generating critical scenarios in autonomous driving tests as claimed in claim 1, wherein the constructing an initial vehicle driving test scenario based on a lane coordinate system comprises:

generating, according to rationality rule, initial positions of all objects by using spatial logic and based on the lane coordinate system;

assuming that there are N elements in the initial vehicle driving test scenario, where $N \in \mathbb{N}_+$; a position of any one of the N elements is denoted by p, and $p=(p_x, p_y)^T \in \mathbb{R}^2$, where $p_x$ presents a projection position of the element on an x-axis in the lane coordinate system, and $p_y$ represents a projection position of the element on a y-axis in the lane coordinate system, expressing a distance between two elements, which are $item_i$ and $item_j$, as $dist(item_i, item_j)=|item_i \cdot p - item_j \cdot p|_2$, i, $j \in \{1,2, \ldots, N\}$, a set of all elements in the initial vehicle driving test scenario is denoted as $x=(item_1, item_2, \ldots, item_N)^T$, T represents matrix transposition, $item_i \cdot p$ represents a projection position of the element $item_i$ on the lane coordinate system, and $item_j \cdot p$ represents a projection position of the element $item_j$ on the lane coordinate system;

expressing positional relationships of the N elements on a two-dimensional plane based on projection as front, back, left, and right, represented by FrontOf, BackOf, LeftOf, and RightOf, respectively, wherein positional relationships of the elements $item_i$ and $item_j$ are defined as follows:

$$FrontOf(item_i, item_j) := proj_y(item_i \cdot p) > proj_y(item_j \cdot p)$$

$$BackOf(item_i, item_j) := \neg \, Front(item_i, item_j)$$

$$LeftOf(item_i, item_j) := proj_x(item_i \cdot p) < proj_x(item_j \cdot p)$$

$$RightOf(item_i, item_j) := \neg \, LeftOf(item_i, item_j)$$

where $proj_x$ presents a projection onto the x-axis, $proj_y$ presents a projection onto the y-axis, and $\neg$ represents negation; and expressing quantitatively a spatial relationship of the set of all elements x in the initial vehicle driving test scenario as follows: $\emptyset(x, \mathcal{R}) \in \mathbb{R}$, and expressing quantitatively a spatial relationship of the elements as follows:

$$\emptyset(x, LeftOf(item_i, item_j)) = proj(item_i \cdot p) - proj_x(item \cdot p)$$

$$\emptyset(x, RightOf(item_i, item_j)) = -\emptyset(x, LeftOf(item_i, item_j))$$

$$\emptyset(x, FrontOf(item_i, item_j)) = proj_y(item_i \cdot p) - proj_x(item \cdot p)$$

$$\emptyset(x, BackOf(item_i, item_j)) = -\emptyset(x, FrontOf(item_i, item_j))$$

$$\emptyset(x, CloseTo(item_i, item_j)) = \varepsilon - dist(item_i, item_j)$$

$$\emptyset(x, FarFrom(item_i, item_j)) = dist(item_i, item_j) - M$$

where M and $\varepsilon$ represent user-defined large and small numbers, respectively.

3. The method for generating critical scenarios in autonomous driving tests as claimed in claim 1, wherein the influence of the acceleration change rate Jerk of the autonomous vehicle $V_{11}$ and the time-to-collision TTC of the autonomous vehicle $V_{11}$ on the one-way single-lane following scenario is used as the reward function of the one-way single-lane following scenario, and the reward function for the one-way single-lane following scenario is expressed as follows:

$$f(v_{follow}) =$$

$$\begin{cases} 0.1 * \text{Jerk} + 2/3 * (1/TTC - 1/2), \; 4 \leq \text{Jerk} \leq 10, \, 0.5 \leq TTC \leq 2 \\ 0.1 * \text{Jerk}, \; 4 \leq \text{Jerk} \leq 10, \, TTC = 0 \end{cases}$$

$$TTC = \frac{X_L(t) - X_F(t) - D_L}{V_F(t) - V_L(t)}, \; V_F(t) - V_L(t) > 0$$

$$\text{Jerk} = \frac{d(a)}{d(t)} = \frac{d^2(v)}{d(t)^2} = \frac{d^3(d)}{d(t)^3}$$

where $X_{L(t)}$ represents a position of a leading vehicle at a time t, $X_{F(t)}$ represents a position of a following vehicle at the time t, $D_L$ represents a length of the leading vehicle, and $V_{F(t)}-V_{L(t)}$ represents a speed difference between the following vehicle and the leading vehicle at the time t; Jerk represents an acceleration change rate of the autonomous vehicle over time, the higher the Jerk, and the higher the critical coefficient of the one-way single-lane following scenario; TTC represents a time to collision, and the smaller the TTC, the higher a collision probability of the autonomous vehicle and the agent vehicle; and when the TTC is less than or equal to 2, the two vehicles are in a critical status where a collision is imminent.

4. The method for generating critical scenarios in autonomous driving tests as claimed in claim 3, wherein when an absolute value of the Jerk is greater than or equal to 4, the acceleration change rate of the autonomous vehicle with time reaches the critical status; when the TTC is less than or equal to 2, the two vehicles are in the critical status where the collision is imminent.

5. The method for generating critical scenarios in autonomous driving tests as claimed in claim 1, wherein the difference between the minimum longitudinal safe distance of the RSS model and the actual longitudinal distance between the autonomous vehicle $V_{21}$ and the agent vehicle $V_{22}$ is used as the reward function of the one-way dual-lane cut-in scenario, and the reward function of the one-way dual-lane cut-in scenario is expressed as follows:

$$f(v_{cut\_in}) = d_{min\_RSS} - d_{min}$$

$$d_{min\_RSS} = \left[ v_r\rho + \frac{1}{2}a_{max,accel}\rho^2 + \frac{(v_r + \rho a_{max,accel})^2}{2a_{min,brake}} - \frac{v_f^2}{2a_{max,brake}} \right]$$

$$d_{min} = x_r - x_f$$

where $v_r$ and $v_f$ represent longitudinal speeds of a rear vehicle and a front vehicle, $\rho$ represents a response time, $a_{max,accel}$ represents a maximum acceleration, $a_{min,brake}$ represents a minimum deceleration, and $a_{max,brake}$ represents a maximum deceleration; wherein the RSS model is introduced, and thus for the target moment, when the actual longitudinal distance $d_{min}$ between the autonomous vehicle $V_{21}$ and the agent vehicle $V_{22}$ is less than the minimum longitudinal safe distance $d_{min\_RSS}$ of the RSS model, the scenario at the target moment is determined as the critical scenario.

6. A system for generating critical scenarios in autonomous driving tests, comprising:

an initial scenario generation module, configured for constructing an initial vehicle driving test scenario based on a lane coordinate system;

a car-following scenario construction module, configured for constructing a one-way single-lane following scenario, comprising:

creating a road and vehicles based on the initial vehicle driving test scenario, the vehicles comprising an autonomous vehicle $V_{11}$ controlled by an intelligent driving model IDM and an agent vehicle $V_{12}$, where the autonomous vehicle $V_{11}$ follows the agent vehicle $V_{12}$; and using an influence of an acceleration change rate Jerk of the autonomous vehicle $V_{11}$ and a time-to-collision TTC of the autonomous vehicle $V_{11}$ on the one-way single-lane following scenario as a reward function of the one-way single-lane following scenario, wherein the higher the Jerk and the smaller the TTC, the higher a critical coefficient of the one-way single-lane following scenario;

a cut-in scenario construction module, configured for constructing a one-way dual-lane cut-in scenario, comprising:

creating a dual-lane road and vehicles based on the initial vehicle driving test scenario, the vehicles comprising an autonomous vehicle $V_{21}$ controlled by the IDM and an agent vehicle $V_{22}$, wherein the agent vehicle $V_{22}$ is behind the autonomous vehicle $V_{21}$;

in response to the autonomous vehicle $V_{21}$ detecting that the agent vehicle $V_{22}$ in a current lane is approaching, choosing, by the autonomous vehicle $V_{21}$, to switch from the current lane to another lane;

in response to the autonomous vehicle $V_{21}$ moving away from the agent vehicle $V_{22}$, choosing, by the autonomous vehicle $V_{21}$, to keep driving on the current lane and decelerate;

introducing a responsibility-sensitive safety (RSS) model, and using a difference between a minimum longitudinal safe distance of the RSS model and an actual longitudinal distance between the autonomous vehicle $V_{21}$ and the agent vehicle $V_{22}$ as a reward function of the one-way dual-lane cut-in scenario;

for a target moment, when the actual longitudinal distance $d_{min}$ between the autonomous vehicle $V_{21}$ and the agent vehicle $V_{22}$ is less than the minimum longitudinal safe distance $d_{min\_RSS}$ of the RSS model, determining a scenario at the target moment as a critical scenario;

a critical scenario generation module, configured for generating the critical scenarios in autonomous driving tests based on the constructed one-way single-lane following scenario and the constructed one-way dual-lane cut-in scenario.

7. A computer device for generating critical scenarios in autonomous driving tests, comprising: a memory, a processor, and a computer program stored in the memory, wherein the processor is configured to, when executing the computer program, implement steps of the method for generating critical scenarios in autonomous driving tests as claimed in claim 1.

8. A non-transitory computer-readable storage medium, wherein a computer program comprising program instructions is stored in the non-transitory computer-readable storage medium, and the program instructions, when executed by a processor, are configured to perform steps of the method for generating critical scenarios in autonomous driving tests as claimed in claim 1.

* * * * *